United States Patent [19]
Chiang et al.

[11] Patent Number: 6,018,250
[45] Date of Patent: Jan. 25, 2000

[54] PROGRAMMING METHOD TO ENABLE SYSTEM RECOVERY AFTER POWER FAILURE

[75] Inventors: David Chiang, Saratoga; Neil G. Jacobson, Mountain View, both of Calif.

[73] Assignee: Xilinx, Inc., San Jose, Calif.

[21] Appl. No.: 08/884,363

[22] Filed: Jun. 26, 1997

[51] Int. Cl.⁷ .................. H03K 19/003; H03K 19/173
[52] U.S. Cl. .................. 326/38; 326/9; 395/500.17; 714/8; 714/47
[58] Field of Search .................. 326/38, 39, 40, 326/41, 8, 9; 364/490, 491; 395/500.13–500.18; 714/7, 8, 14, 47

[56] References Cited

U.S. PATENT DOCUMENTS 5,737,235   4/1998   Kean et al. .................. 364/490
5,869,979   2/1999   Bocchino .................. 326/38

*Primary Examiner*—Michael Tokar
*Assistant Examiner*—Richard Roseen
*Attorney, Agent, or Firm*—Jeanette S. Harms

[57] ABSTRACT

A programming method of a programmable logic device (PLD) to enable system recovery after power failure is provided. Key configuration bits controlling output enable signals of the PLD are programmed at a different time than all other configuration bits in the PLD. If those key bits are unprogrammed, the PLD behaves identically to a fully erased device. Thus, by programming the key configuration bits after all other bits are successfully programmed, any potential damage to the system is virtually eliminated. In this manner, if the main programming sequence is interrupted, the PLD will power up with partial internal activity, but no active output signals. Moreover, even if the interruption occurs during the programming of these few bits, the result is only a partial activation of output signals which is significantly better than the activation of output signals with incorrect functions.

3 Claims, 3 Drawing Sheets

PROGRAMMING METHOD TO ENABLE SYSTEM RECOVERY AFTER POWER FAILURE

BACKGROUND OF THE INVENTION

1. Field of the Invention

The present invention relates to programming in programmable logic devices, and specifically to a programming method in these devices to enable system recovery after power failure.

2. Description of the Related Art

Many complex digital systems use logic that can be reprogrammed. For example, a system may contain a microprocessor, memory, I/O interface circuitry, and a programmable logic device (PLD) to control key logic functions. A PLD allows the logic functions to be changed for bug fixes, system upgrades, enhancements, or system customization. Preferably, a PLD in such a system is in-system programmable (ISP), thereby providing the capability of reprogramming the device in the field within the system, rather than requiring the system to be shipped back to the factory. The new programming data (also referred to herein as configuration data) for the PLD can be contained on a floppy disk to be read by a CPU and supplied to the PLD by a download cable or by any other means well known in the art.

FIG. 1 illustrates a prior art method used to program an ISP PLD. To invoke an ISP mode in the PLD, a special command is issued to the PLD in step 101. The PLD is completely erased in step 102 to maximize programming uniformity. In step 103, the address is set to zero. The programming addresses and data are then downloaded by programming the current address and configuration data (step 104), incrementing the address (step 105), and determining whether the programming is done (step 106). Steps 104–106 are repeated until all the configuration bits of the PLD are programmed. Finally, the ISP mode is exited in step 107, thereby allowing the new programming data to reconfigure the device for its new logic function in step 108.

However, this field programming method is susceptible to power failures that can damage the system. Specifically, because the upgrade is done in the field where the electrical environment is not as stable as the factory, there is a chance that the programming process can be interrupted by a power outage. In the case of a power outage during programming, the PLD is only partially programmed and thus may contain an internally inconsistent configuration that can cause system damage. For example, the user's configuration data may provide that a particular output signal driving a tristate bus is disabled by another signal in the design. However, in a partially programmed PLD, the disable signal may not be implemented, thereby causing the signal to be driving at the wrong time. Other equally undesirable behavior can easily be possible for a partially programmed PLD. Therefore, after the PLD is powered up after a power failure, it may enter into an irreparable destructive state in the system before the full and correct configuration data is programmed into it.

Therefore, there is a need to provide a method of programming during field upgrades that guards against system damage caused by a power failure or other disturbances during in-system programming.

SUMMARY OF THE INVENTION

In the present invention, key configuration bits controlling output enable signals are programmed at a different time than all other configuration bits in the PLD. If those key bits are unprogrammed, the device behaves identically to a fully erased device. Thus, by programming the key configuration bits after all other bits are successfully programmed, any potential damage to the system is virtually eliminated. Specifically, if the main programming sequence is interrupted, the device will power up with partial internal activity, but no active output signals. Moreover, even if the interruption occurs during the programming of these few bits, the result is only a partial activation of output signals which is significantly better than the activation of output signals with incorrect functions.

In one embodiment of the present invention, to invoke an ISP mode in the PLD, a special command is issued to the PLD. The PLD is typically completely erased to maximize programming uniformity. The address of a first configuration bit of the PLD is set to zero. If the bit at the current address is not an output enable bit, the bit is programmed with the appropriate configuration data. Then the address is incremented. Programming continues until all configuration bits, excluding output enable bits, are programmed. Finally, the output enable bits are programmed. The ISP mode is then exited, thereby allowing the new programming data to reconfigure the device for its new logic function.

The present invention can also be used in a system having its own power failure recovery mechanism that allows the system to recover and restart the interrupted process. For example, the use of the IEEE Std. 1149.1 test access port as the protocol and interface for programming facilitates detection in the present invention when a to-be-programmed non-volatile PLD has lost power. In this case, if a power glitch occurs, the device executes a test-logic-reset operation. In this state, subsequent accesses of the data register will always result in fixed data being shifted out of the test access port. This fixed data is an identification code which is fixed and unique for each type of device. In one embodiment of the invention, after programming each configuration bit, the data output of the test access port is compared to the identification code. If a match occurs, thereby indicating that power was momentarily lost, the method of the present invention directs the device to re-enter the programming mode and continue from the point of failure.

DETAILED DESCRIPTION OF THE DRAWINGS

In a PLD, there are a small number of key configuration bits that can disable potentially destructive behavior. For example, in a XC9536 PLD, manufactured by Xilinx, Inc. of San Jose, Calif., there are two key bits for each of the 34 output pins on the device, for a total of 78 key configuration bits. Note that there are approximately 40,000 bits in the XC9536 PLD. Therefore, key bits in this device only comprise 0.195% of the total configuration bits for the PLD. In the present invention, those key bits are programmed only after all the other configuration bits in the PLD are programmed. If those key bits are unprogrammed, the device behaves identically to a fully erased device. Thus, in the present invention, potential system damage due to power fluctuation or outage is substantially eliminated regardless of the internal configuration.

Figure 1:
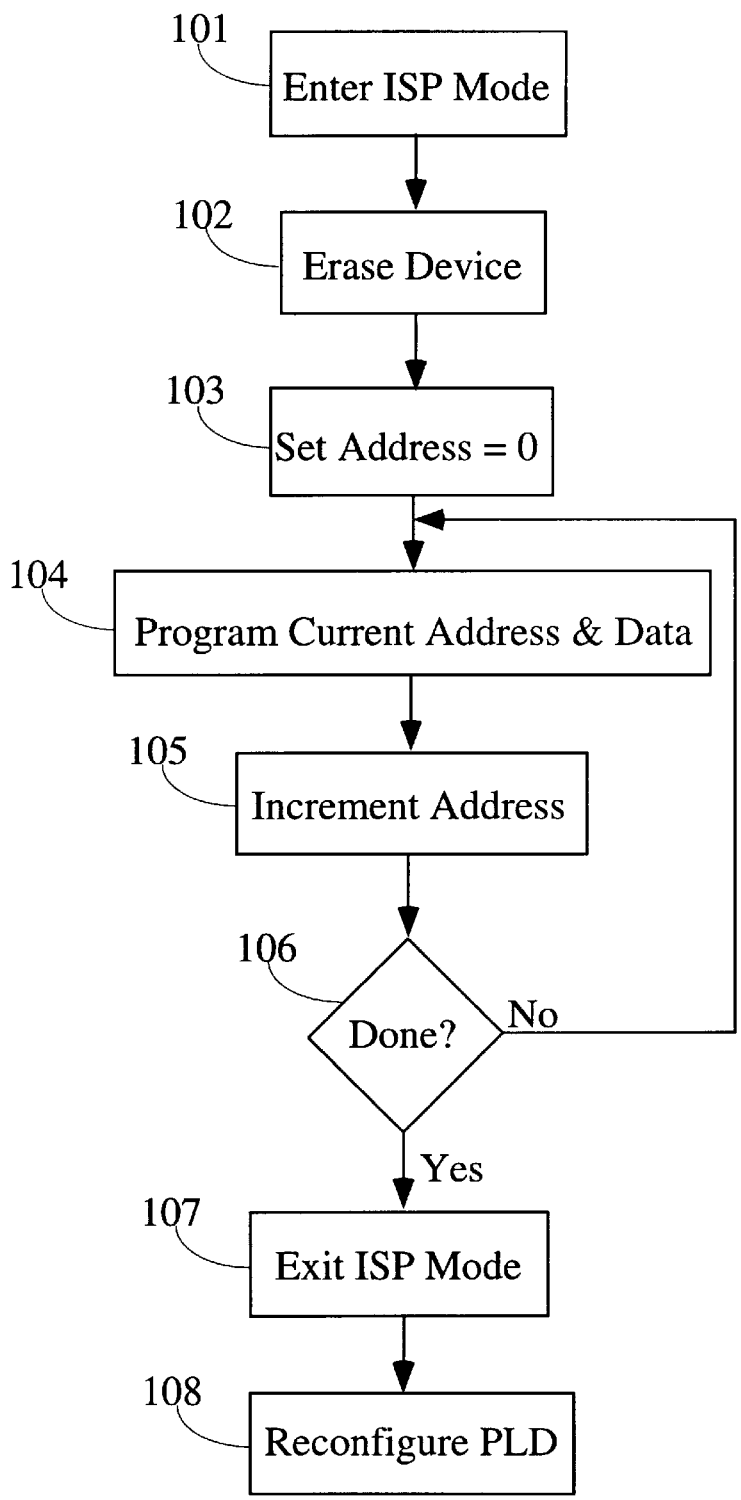
FIG. 1 illustrates a flow chart of the prior art method of programming an ISP PLD.
Figure 2:
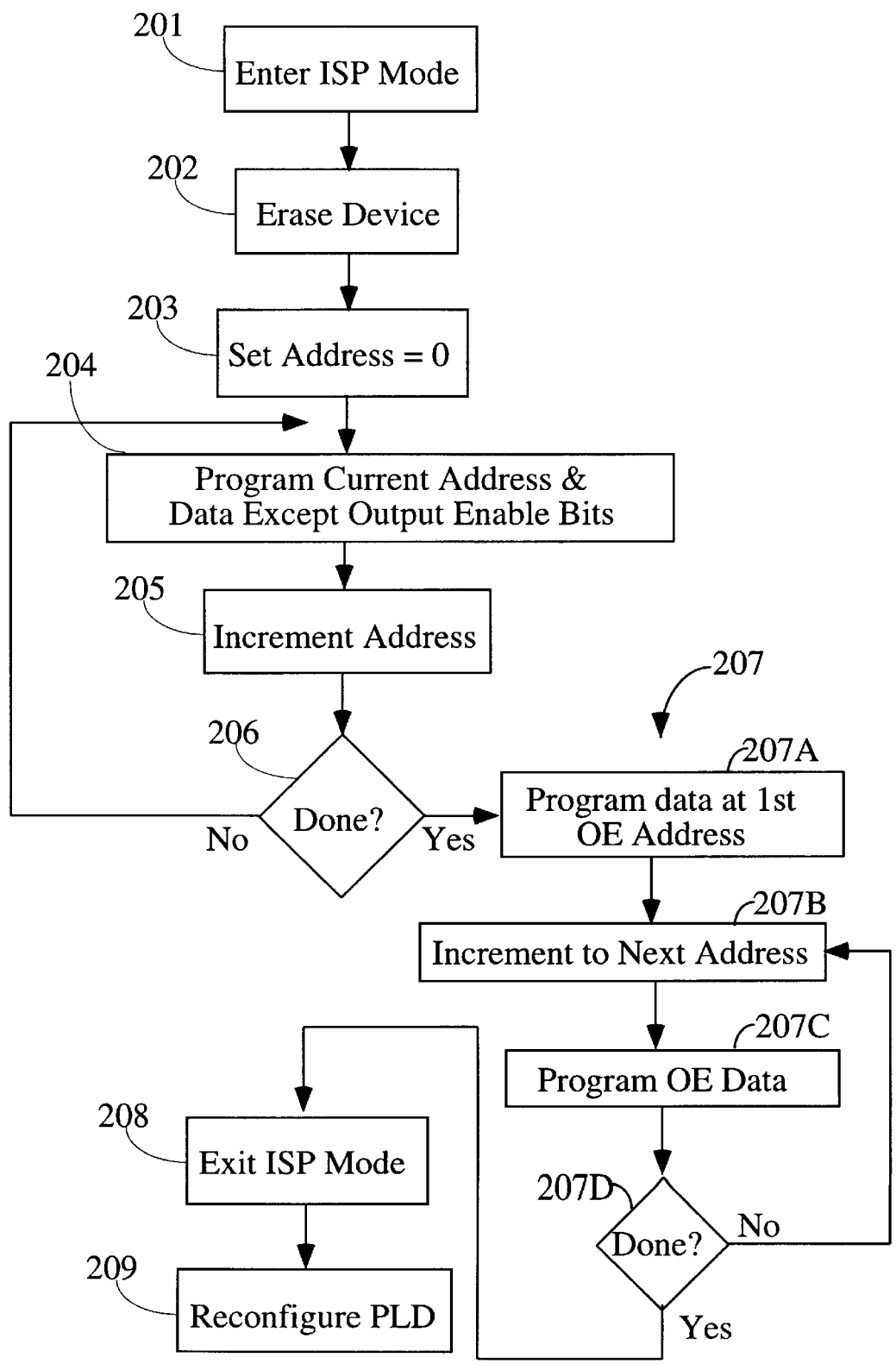
FIG. 2 shows a flow chart of the programming method of the present invention.

FIG. 2 illustrates a method used to program an ISP PLD in accordance with the present invention. To invoke an ISP mode in the PLD, a special command is issued to the PLD in step 201. The PLD is completely erased in step 202 to maximize programming uniformity. In step 203, the address of a first configuration bit is set to zero. Then, the bit at the current address, unless the bit is an output enable bit, is programmed with the appropriate configuration data (step 204). The address is incremented in step 205. If any bits, excluding output enable bits, have not been programmed, as determined in step 206, steps 204 and 205 are repeated. If all bits, except output enable bits, have been programmed, then those enable bits are finally programmed in step 207. Specifically, the program data at the first output enable address is programmed in step 207A. Step 207B increments to the next address. The output enable data at that address is programmed in step 207C. If the programming is not done, as determined in step 207D, then steps 207B–207D are repeated until the programming is complete. Once completed, the ISP mode is exited in step 208, thereby allowing the new programming data to reconfigure the device for its new logic function in step 209.

By separating this small number of "enabling" bits to be programmed after all the other bits are successfully programmed, any potential damage to the system is substantially eliminated. Specifically, if the main programming sequence is interrupted, the device will power up with partial internal activity, but no active output signals. Moreover, even if the interruption occurs during the programming of these relatively few bits, which is an extremely small probability, the result is only a partial activation of output signals which is significantly more benign than the activation of output signals with incorrect functions.

In some systems, the programming algorithm controller has its own power failure recovery mechanism that allows the systems to recover and restart the interrupted process. For example, the use of the IEEE Std. 1149.1 test access port (TAP) as the protocol and interface for programming facilitates detection in the present invention when the to-be-programmed PLD has lost power. In this case, if a power glitch occurs, the device executes a test-logic-reset (TEST) operation. In this state, subsequent accesses of the data register will always result in fixed data being shifted out of the TAP. This data is a 32 bit IDCODE (also defined by the IEEE Std. 1149.1). This IDCODE is fixed and unique for each type of device. Note that the IEEE Std. 1149.1 on boundary scan is well known in the art and therefore not explained in detail herein.

Figure 3:
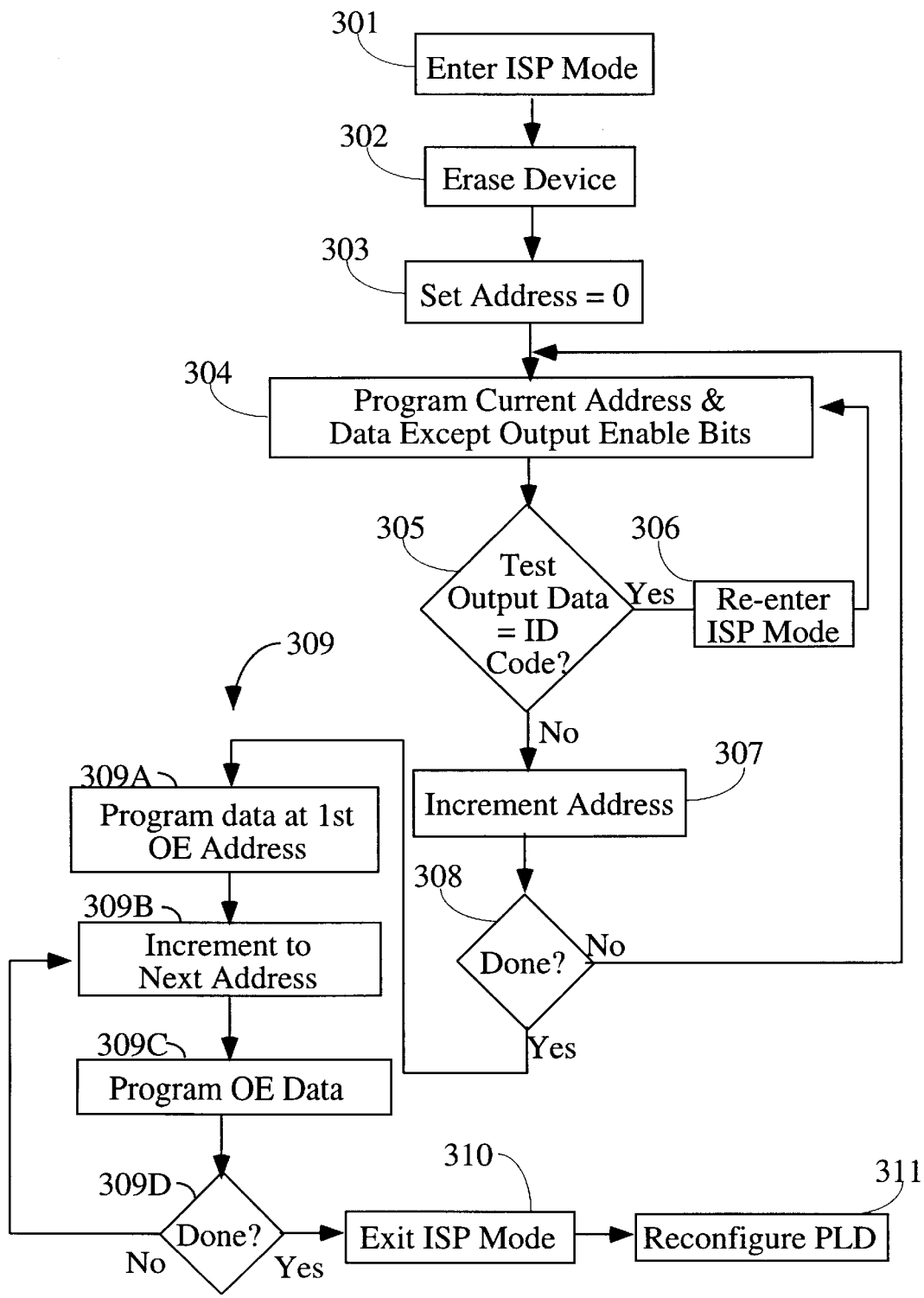
FIG. 3 illustrates another method for programming an ISP PLD in accordance with the present invention.

FIG. 3 illustrates a method of programming an ISP non-volatile PLD using this IDCODE. To invoke an ISP mode in the PLD, a special command is issued to the PLD in step 301. The PLD is once again completely erased in step 302. In step 303, the address is set to zero. Then, the bit at the current address, unless the bit is an output enable bit, is programmed with the appropriate configuration data (step 204). If the test output data matches the PLD IDCODE (thereby indicating that power was momentarily lost) as determined in step 305, then the ISP mode is re-entered in step 306. Note that a power loss automatically triggers an exit from the ISP mode. The method of the present invention directs the device to re-enter the programming mode and continue from the point of failure.

Steps 304 and 305 are repeated until the test output data does not match the PLD IDCODE, thereby indicating that power has been restored. Then, the address is incremented in step 307. If any bits, excluding output enable bits, have not been programmed, as determined in step 308, steps 304–307 are repeated as appropriate. If all bits, except output enable bits, have been programmed, then those enable bits are finally programmed in step 309. Specifically, the program data at the first output enable address is programmed in step 309A. Step 309B increments to the next address. The output enable data at that address is programmed in step 309C. If the programming is not done, as determined in step 309D, then steps 309B–309D are repeated until the programming is complete. Once completed, the ISP mode is exited in step 310, thereby allowing the new programming data to reconfigure the device for its new logic function in step 311.

The present invention is not limited to the embodiments described in reference to FIGS. 2 and 3. For example, although these embodiments include the steps of setting an address to zero and incrementing this address after programming of a configuration bit, other embodiments of the invention may begin at a different address and choose the next address in other ways. Thus, other embodiments and variations not described herein may be considered within the scope of the invention by one or more of the following claims.

We claim:

1. A method of programming a programmable logic device (PLD) comprising:

(i) invoking an in-system programmable (ISP) mode in the PLD;

(ii) determining whether a bit at a current address is an output enable bit;

(iii) programming the bit if the bit is other than an output enable bit;

(iv) choosing another address;

(v) repeating steps (ii) through (iv) until all bits, other than output enable bits, are programmed; and (vi) programming the output enable bits.

2. A method of programming a programmable logic device (PLD) comprising:

(i) invoking an in-system programmable (ISP) mode in the PLD;

(ii) determining whether a bit at a current address is an output enable bit;

(iii) programming the bit if the bit is other than an output enable bit;

(iii)(a) determining whether data from a register matches an identification code of the PLD, wherein the PLD includes non-volatile technology;

(iii)(a)(1) if a match occurs, directing the PLD to re-enter the ISP mode and continue from the point of failure; and (iii)(a)(2) if a match does not occur, continuing to step (iv);

(iv) choosing another address;

(v) repeating steps (ii) through (iv) until all bits, other than output enable bits, are programmed; and (vi) programming the output enable bits.

3. A method to enable system recovery after power failure, the system including an ISP PLD, the method comprising:

programming predetermined configuration bits at a different time than all other configuration bits in the PLD, wherein said predetermined configuration bits comprise output enable bits.

\* \* \* \* \*